United States Patent
Kobayashi et al.

[11] Patent Number: 5,095,283
[45] Date of Patent: Mar. 10, 1992

[54] AMPLIFIER CIRCUIT HAVING FEEDBACK CIRCUIT

[75] Inventors: Kazuhiko Kobayashi, Kawasaki; Hiroshi Kurihara, Tokyo; Naofumi Okubo, Kawasaki; Yoshihiko Asano, Tokyo; Yoshimasa Daido; Shuji Kobayakawa, both of Yokohama; Toru Maniwa, Kawasaki, all of Japan

[73] Assignee: Fujitsu Limited, Kanagawa, Japan

[21] Appl. No.: 652,080

[22] Filed: Feb. 7, 1991

[30] Foreign Application Priority Data

Feb. 7, 1990 [JP] Japan .................................. 2-28008

[51] Int. Cl.⁵ .............................................. H03F 1/26
[52] U.S. Cl. ................................... 330/109; 330/149; 330/306
[58] Field of Search .............. 330/53, 109, 149, 286, 330/294, 302, 306; 331/74, 76, 77, 117 D; 333/109

[56] References Cited

U.S. PATENT DOCUMENTS 4,540,956  9/1985  Chauvin et al. ............... 330/306 X
4,871,984  10/1989  Laton et al. ..................... 331/76 X Primary Examiner—Steven Mottola
Attorney, Agent, or Firm—Helfgott & Karas

[57] ABSTRACT

An amplifier circuit includes a high-gain amplifier, and a feedback circuit for extracting an unstable output having a level equal to or less than a threshold level from an amplified signal from the amplifier and for feeding back the unstable signal to the amplifier, so that the amplifier oscillates at a predetermined oscillation frequency. The amplifier circuit also includes a band rejection filter for passing signal components of the amplified signal other than an oscillation output which is obtained at the output terminal of the amplifier when the amplifier oscillates at the predetermined oscillation frequency. The signal components obtained from the band rejection filter are an output signal of the amplifier circuit.

10 Claims, 3 Drawing Sheets

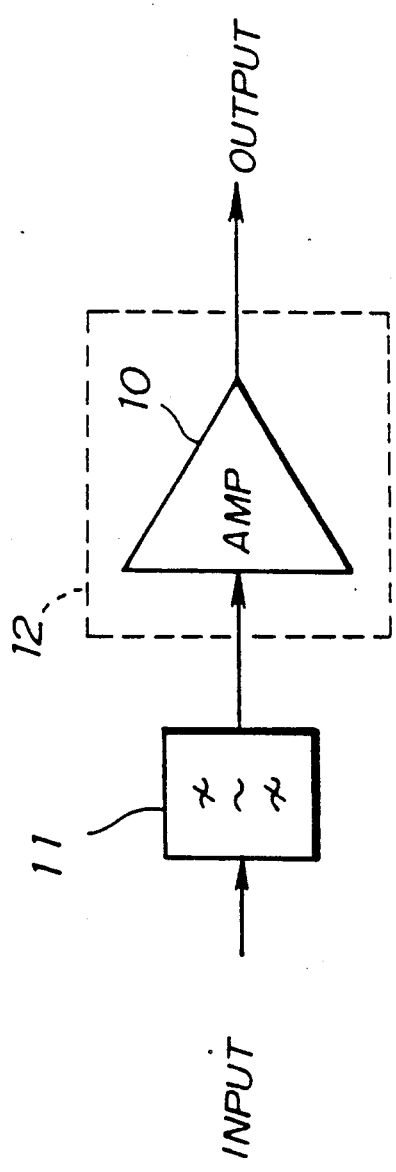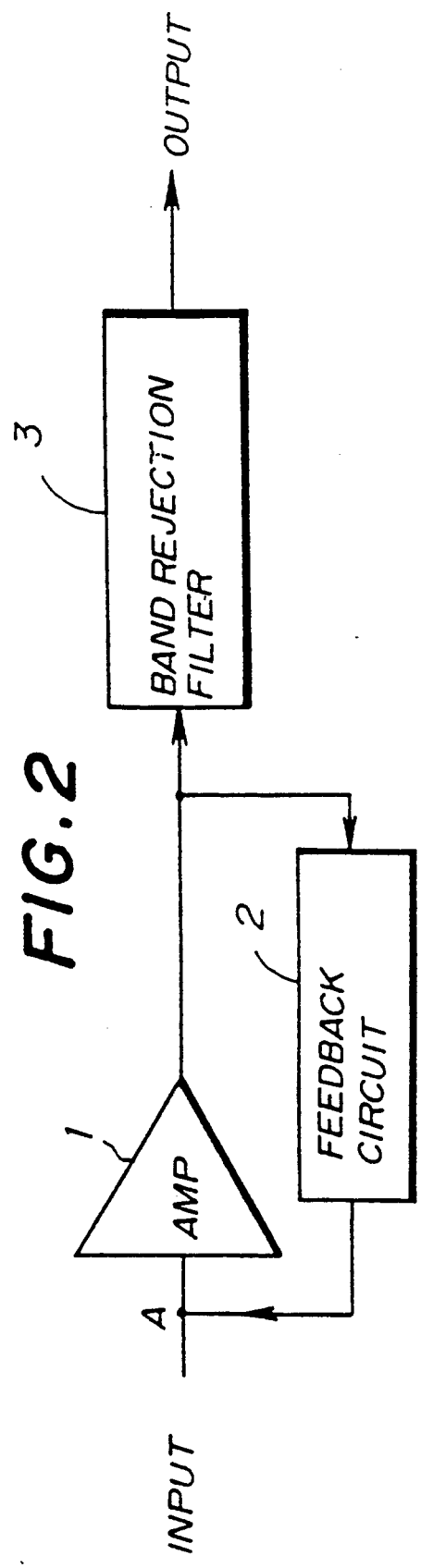

5,095,283

AMPLIFIER CIRCUIT HAVING FEEDBACK CIRCUIT

BACKGROUND OF THE INVENTION

The present invention generally relates to amplifier circuits, and more particularly to an amplifier circuit having a feedback circuit and a high-gain amplifier.

A circuit having a high-gain amplifier, such as a limiter amplifier, amplifies a noise component when no input signal is applied to the high-gain amplifier. Thus, it is necessary to prevent the circuit having the high-gain amplifier from outputting amplified noise components when no input signal is applied thereto.

FIG.1 shows a conventional amplifier circuit having a high-gain amplifier. The amplifier circuit shown in FIG.1 has a high-gain amplifier (AMP) 10, such as a limiter amplifier. A filter 11, which is provided on the input side of the high-gain amplifier 10, functions to prevent noise components from being input to the high-gain amplifier 10. The filter 11 has a narrow frequency band designed to have frequencies other than an inherent oscillation frequency of the high-gain amplifier 10. In place of or in addition to the filter 11, a shield case 12 is provided so that it shields the high-gain amplifier 10. The shield case 12 prevents the high-gain amplifier 10 from being affected by noise.

However, the use of the filter 11 or the shield case 12 cannot completely eliminate the influence of noise on the amplifier. Particularly, it is very difficult to completely prevent the outputting of noise signals by means of the filter 11 or the shield case 12.

SUMMARY OF THE INVENTION

It is a general object of the present invention to provide an improved amplifier circuit having a high-gain amplifier in which the above-mentioned disadvantages are eliminated A more specific object of the present invention is to provide an amplifier circuit which does not output amplified noise components when no signal is applied thereto.

The above-mentioned objects of the present invention are achieved by an amplifier circuit comprising:

an amplifier having an input terminal receiving an input signal and an output terminal outputting an amplified signal;

feedback circuit means, coupled between the input terminal and the output terminal of the amplifier, for extracting an unstable output having a level equal to or less than a threshold level from the amplified signal and for feeding back the unstable signal to the input terminal, so that the amplifier oscillates at a predetermined oscillation frequency; and filter means, coupled to the output terminal of the amplifier, for passing signal components of the amplified signal other than an oscillation output which is obtained at the output terminal of the amplifier when the amplifier oscillates at the predetermined oscillation frequency, the signal components obtained from the filter means being an output signal of the amplifier circuit.

BRIEF DESCRIPTION OF THE DRAWINGS

Other objects, features and advantages of the present invention will become more apparent from the following detailed description when read in conjunction with the accompanying drawings, in which:

FIG. 1 is a block diagram of a conventional amplifier circuit having a high-gain amplifier;

FIG. 2 is a block diagram illustrating an outline of an amplifier circuit according to the present invention;

DESCRIPTION OF THE PREFERRED EMBODIMENTS

Referring to FIG.2, an amplifier circuit has a high-gain amplifier 1, a feedback circuit 2 and a band rejection filter (BRF) 3. The feedback circuit 2 is connected between the input terminal and output terminal of the high-gain amplifier 1. The band rejection filter 3 has an input terminal connected to the output terminal of the high-gain amplifier 1, and an output terminal at which an amplified signal is obtained.

The feedback circuit 2 feeds back an unstable output signal obtained at the output terminal of the high-gain amplifier 1 to the input terminal thereof, and causes the high-gain amplifier 1 to oscillate at a predetermined frequency (inherent oscillation frequency). The unstable output signal obtained at the output terminal of the high-gain amplifier 1 results from a noise signal applied to the high-gain amplifier 1 when no input signal is applied thereto, and has a level equal to or less than a predetermined level of the output signal which is output by the high-gain amplifier 1. It is not desired that the above unstable output signal be amplified. The band rejection filter 3 eliminates an oscillation output obtained while the high-gain amplifier 1 is oscillating.

The output signal of the high-gain amplifier 1 is partially fed back to the input terminal thereof due to the function of the feedback circuit 2. During the above operation, the feedback circuit 2 functions to cause the high-gain amplifier 1 to oscillate at the inherent oscillation frequency thereof. However, it is necessary to prevent the high-gain amplifier 1 from oscillating at frequencies which are required to be output. In other words, it is not desired that the feedback circuit 2 oscillate at frequencies of the output signal to be outputted from the amplifier.

Figure 3:
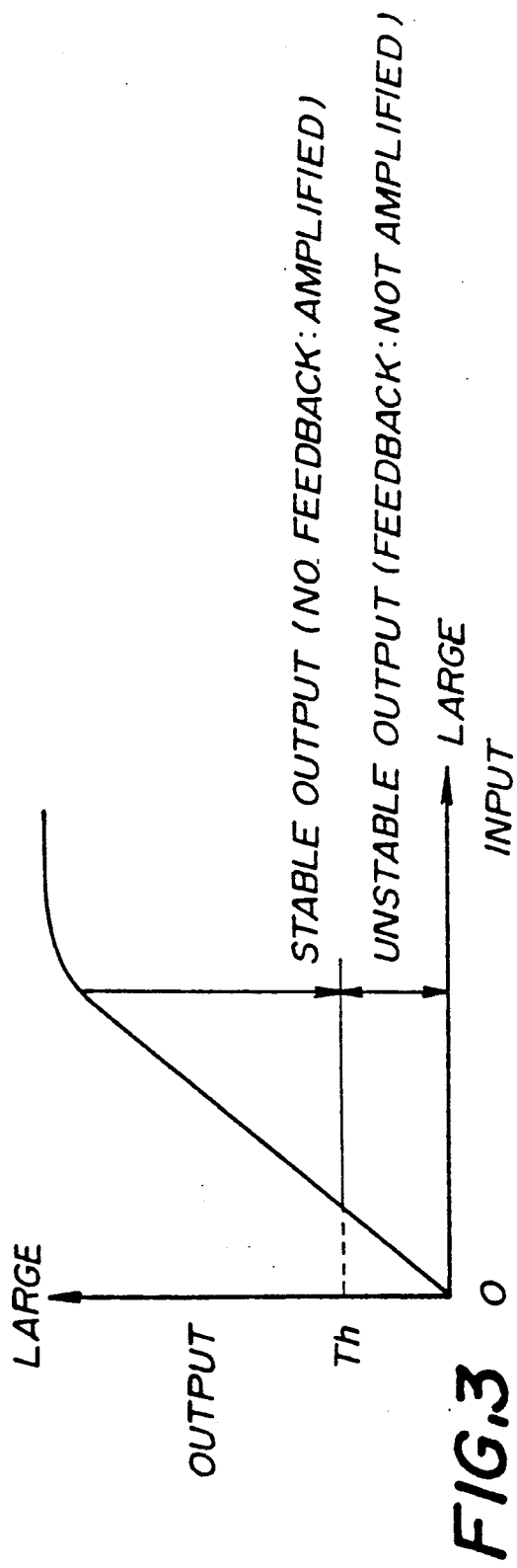
FIG. 3 is a graph showing the relationship between an input signal applied to a high-gain amplifier shown in FIG. 2 and an output signal output therefrom.

The high-gain amplifier 1 has an input/output characteristic as shown in FIG.3. The input/output characteristic curve illustrated by the solid line in FIG.3 has a flat portion in which the output of the high-gain amplifier 1 is substantially constant, and a changing portion in which the output decreases substantially linearly as the input decreases. The high-gain amplifier 1 has a threshold output level Th which is a boundary between a stable output range and an unstable output range. In this unstable output range, the output signal of the high-gain amplifier 1 fluctuates. In other words, the high-gain amplifier has a saturated state and has a high gain when the input signal is small, and a low gain when the input signal is high. The feedback circuit 2 functions to feed back those signal components which have levels equal to or less than the threshold level Th. It is not desired that such signal components be amplified.

Figure 4:
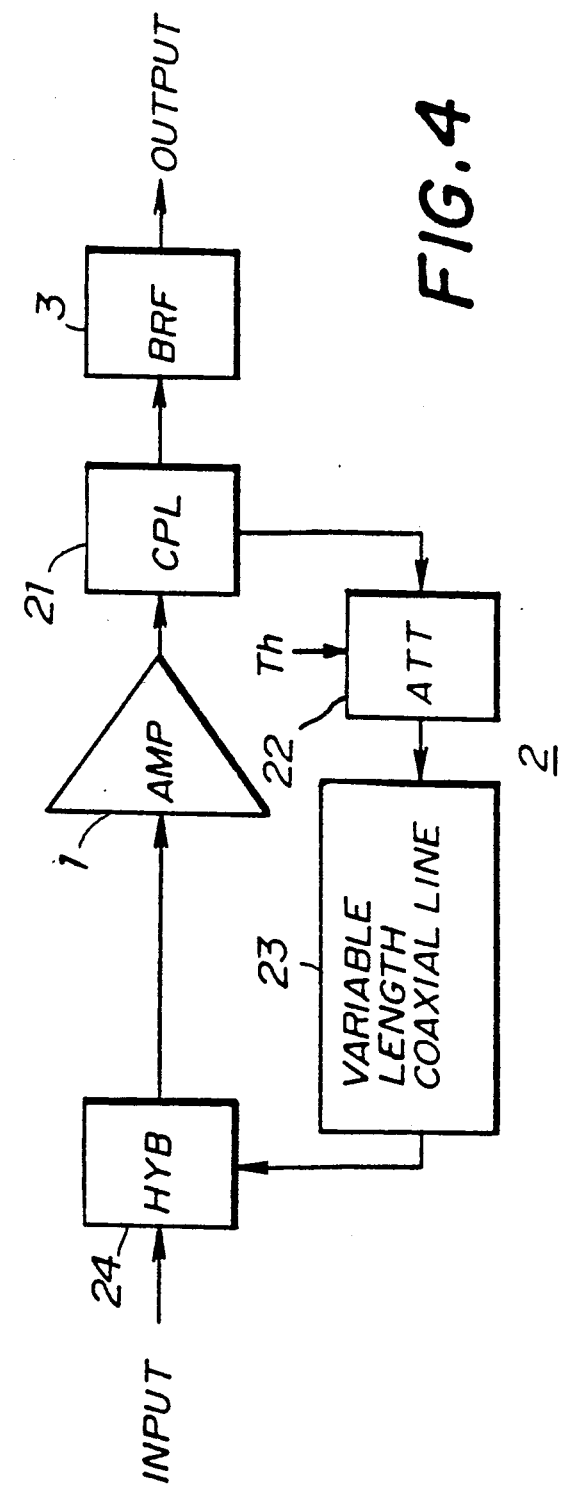
FIG. 4 is a block diagram of an amplifier circuit according to a preferred embodiment of the present invention.

The signal components fed back to the input signal of the high-gain amplifier 1 function as a trigger signal which causes the high-gain amplifier 1 to oscillate at its inherent oscillation frequency. The oscillation frequency is prevented from passing through the band rejection filter 3. With the above-described arrangement, it is possible to prevent the amplifier circuit shown in FIG.2 from outputting noise components when no input signal is applied thereto, FIG.4 illustrates the embodiment shown in FIG.2 in more detail. A hybrid circuit (HYB) 24 has an output terminal connected to the input terminal of the high-gain amplifier 1. The hybrid circuit 24 has a first input terminal receiving an input signal and a second input terminal receiving a feedback signal from the feedback circuit 2 and generates a combined signal applied to the high-gain amplifier 1 by combining the signals, for example, in phase with each other. A coupler (CPL) 21 has an input terminal connected to the output terminal of the high-gain amplifier 1, a first output terminal connected to the input terminal of the band rejection filter 3, and a second output terminal connected to the input terminal of the feedback circuit 2. The coupler 21 outputs a part of the output signal from the high-gain amplifier 1 to the feedback circuit 2.

The feedback circuit 2 includes an attenuator (ATT) 22 and a variable length coaxial line 23 connected in series. The attenuator 22 has an input terminal connected to the second output terminal of the coupler 21, an output terminal connected to an input terminal of the variable length coaxial line 23, and a input terminal for receiving the aforementioned threshold level Th. The variable length coaxial line 23 has, in addition to the above-mentioned input terminal, an output terminal connected to the second input terminal of the hybrid circuit 24. The attenuator 22 allows the signal components equal to or less than the threshold level Th to pass through the attenuator 22. The inherent oscillation frequency which causes the high-gain amplifier 1 to oscillate is determined based on the length of the variable length coaxial line 23. For example, the variable length coaxial line 23 is adjusted so that the inherent oscillation frequency now labeled $f_{OSC}$ is equal to the frequency of the input signal. A rejection frequency $F_{RJC}$ of the band rejection filter 3 is determined so that it is equal to the oscillation frequency $f_{OSC}$ ($f_{RJC}=f_{OSC}$).

When no input signal is applied to the input-terminal of the high-gain amplifier 1 from the hybrid circuit 24, the noise signal components, outputted from the amplifier 1 and coupler 21, which are equal to or less than the threshold level Th pass through the attenuator 22 and the variable length coaxial line 23, and are applied as a feedback signal to the hybrid circuit 24 iva its second input terminal. The above noise signal components pass through the hybrid circuit 24, the high-gain amplifier 1 and the coupler 21, and are applied to the attenuator 22. In this way, the signal components, that is, noise components of the high-gain amplifier 1, are drawn into the inherent oscillation frequency, so that the high-gain amplifier 1 is maintained in the oscillating state. Since the rejection frequency $F_{RJC}$ of the band rejection filter 3 is equal to the inherent oscillation frequency $f_{OSC}$, no noise components are output via the band rejection filter 3.

On the other hand, when an input signal in the stable output range is applied to the high-gain amplifier 1 via the hybrid circuit 24, the amplifier amplifies the input signal without oscillating. An amplified input signal passes through the coupler 21 and the band rejection filter 3.

It will be noted that if the attenuator 22 is not provided, the high-gain amplifier 1 will oscillate in response to any input signal. For example, even if an input signal in the stable output range is applied to the high-gain amplifier 1, the latter will oscillate. The attenuator 22 extracts those signal components which are equal to or less than the threshold signal level Th inputted into the attenuator and which signals should not be amplified and outputted at the output terminal of the amplifier. The extracted signal components function to oscillate the high-gain amplifier 1. The setting of the threshold level Th is carried out, taking into account the branch ratio in the coupler 21.

Figure 5:
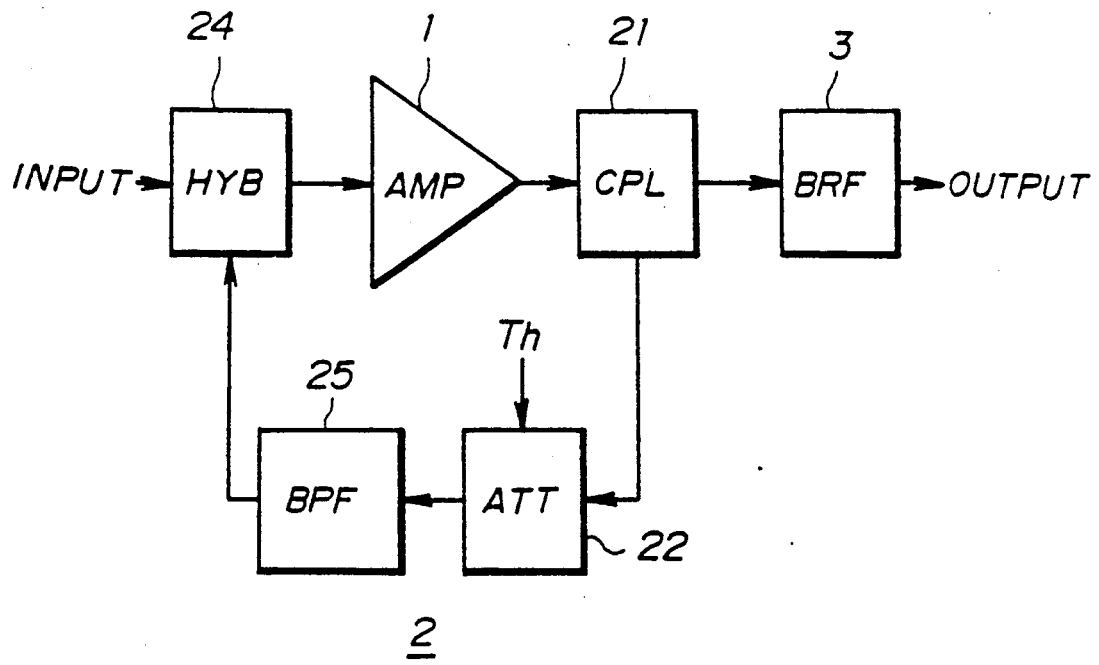
FIG. 5 is a block diagram illustrating a another embodiment of the present invention.

FIG.5 illustrates another embodiment of the amplifier circuit. In FIG.5, those parts which are the same as those shown in FIG.4 are given the same reference numerals. A narrow bandpass filter (BPF) 25 is substituted in the feedback circuit 2 for the variable length coaxial line 23. of the embodiment of FIG. 4 The narrow bandpass filter 25 has such a bandpass range that it passes the signal components which cause the high-gain amplifier 1 to oscillate.

Figure 6:
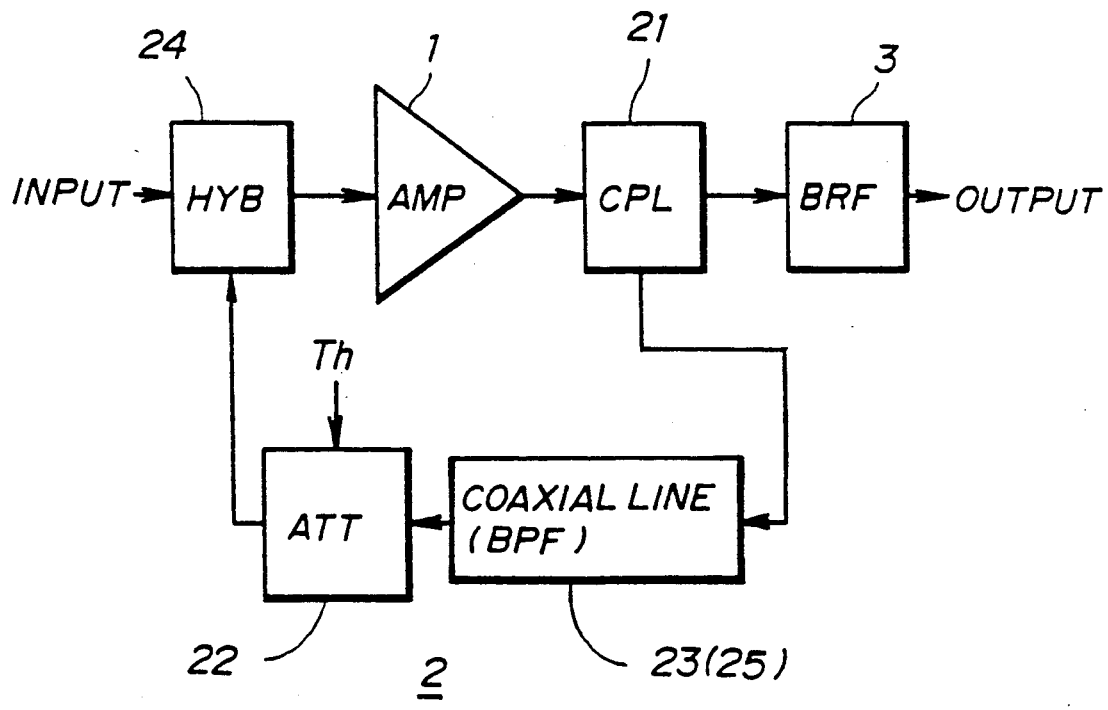
FIG. 6 is a block diagram illustrating yet another embodiment of the amplifier circuit of the present invention.

FIG.6 illustrates yet another embodiment of the amplifier circuit of the present invention. The variable length coaxial line 23 shown in 'FIG.4 or the narrow bandpass filter 25 shown in FIG.5 is provided between the coupler 21 and the attenuator 22 in the feedback circuit 2.

The present invention is not limited to the specifically disclosed embodiments, and variations and modifications may be made without departing from the scope of the present invention.

What is claimed is:

1. An amplifier circuit comprising:
an amplifier having an input terminal receiving an input signal and an output terminal outputting an amplified signal;
feedback circuit means, coupled between said input terminal and said output terminal of said amplifier, for extracting an unstable output having a level equal to or less than a threshold level from said amplified signal and for feeding back said unstable signal to said input terminal, so that said amplifier oscillates at a predetermined oscillation frequency; and
filter means, coupled to said output terminal of said amplifier, for passing signal components of the amplified signal other than an oscillation output which is obtained at said output terminal of said amplifier when said amplifier oscillates at said predetermined oscillation frequency, said signal components obtained from said filter means being an output signal of said amplifier circuit.

2. An amplifier circuit as claimed in claim 1, wherein said amplifier circuit comprises:
coupler means, provided between said output terminal of said amplifier and said filter means, for outputting a branched signal to said feedback means, said branched signal being a part of said amplified signal; and
hybrid circuit means, provided between said feedback circuit means and said input terminal of said amplifier, for combining said input signal and said unstable output and for outputting a combined signal to said input terminal of said amplifier, and wherein said feedback circuit means comprises:

attenuator means for comparing said branched signal with said threshold level and for outputting said unstable output; and frequency adjustment means, coupled to said attenuator means, for adjusting said unstable output so that a frequency of said input signal is substantially equal to said predetermined oscillation frequency.

3. An amplifier circuit as claimed in claim 2, wherein said frequency adjustment means comprises a variable length coaxial line.

4. An amplifier circuit as claimed in claim 2, wherein said frequency adjustment means comprises a bandpass filter.

5. An amplifier circuit as claimed in claim 1, wherein said amplifier circuit comprises:

coupler means, provided between said output terminal of said amplifier and said filter means, for outputting a branched signal to said feedback means, said branched signal being a part of said amplified signal; and hybrid circuit means, provided between said feedback circuit means and said input terminal of said amplifier, for combining said input signal and said unstable output and for outputting a combined signal to said input terminal of said amplifier, and wherein said feedback circuit means comprises:

frequency adjustment means, coupled to said output terminal of said amplifier, for adjusting said branched signal so that a frequency of said input signal is substantially equal to said predetermined oscillation frequency; and attenuator means for comparing said branched signal via said frequency adjustment means with said threshold level and for outputting said unstable output to said hybrid circuit means.

6. An amplifier circuit as claimed in claim 5, wherein said frequency adjustment means comprises a variable length coaxial line.

7. An amplifier circuit as claimed in claim 5, wherein said frequency adjustment means comprises a bandpass filter.

8. An amplifier circuit as claimed in claim 1, wherein said amplifier has an input/output characteristic which has a flat portion in which the level of said amplified output is substantially constant, and a changing portion in which the level of said amplified output decreases as the level of said input signal decreases.

9. An amplifier circuit as claimed in claim 1, wherein: said filter means comprises a band rejection filter having a rejection frequency substantially equal to said predetermined oscillation frequency.

10. An amplifier circuit as claimed in claim 1, wherein said amplifier comprises a limiter amplifier.

* * * * *